(12) United States Patent
Chen

(10) Patent No.: US 7,468,916 B2
(45) Date of Patent: Dec. 23, 2008

(54) NON-VOLATILE MEMORY HAVING A ROW DRIVING CIRCUIT WITH SHARED LEVEL SHIFT CIRCUITS

(75) Inventor: Yin-Chang Chen, Hsin-Chu Hsien (TW)

(73) Assignee: eMemory Technology Inc., Hsinchu (TW)

( * ) Notice: Subject to any disclaimer, the term of this patent is extended or adjusted under 35 U.S.C. 154(b) by 0 days.

(21) Appl. No.: 11/688,262

(22) Filed: Mar. 20, 2007

(65) Prior Publication Data

US 2008/0232173 A1    Sep. 25, 2008

(51) Int. Cl.
*G11C 11/34* (2006.01)
(52) U.S. Cl. .......................... 365/185.23; 365/185.18
(58) Field of Classification Search ............ 365/185.18, 365/185.23
See application file for complete search history.

(56) References Cited

U.S. PATENT DOCUMENTS

| 5,513,147 | A  | * | 4/1996  | Prickett, Jr. | ............ | 365/230.06 |
|---|---|---|---|---|---|---|
| 5,831,905 | A  | * | 11/1998 | Hirano        | ............ | 365/185.29 |
| 6,233,198 | B1 | * | 5/2001  | Choi          | ............ | 365/230.06 |
| 6,587,375 | B2 | * | 7/2003  | Chung et al.  | ............ | 365/185.13 |
| 7,072,218 | B2 | * | 7/2006  | Fujito et al. | ............ | 365/185.18 |
| 7,313,050 | B2 | * | 12/2007 | Lee et al.    | ............ | 365/230.06 |
| 2001/0003511 | A1 | * | 6/2001 | Taura et al. | ............ | 365/185.23 |
| 2001/0053093 | A1 | * | 12/2001| Ogura et al. | ............ | 365/185.23 |
| 2005/0013166 | A1 | * | 1/2005 | Chen et al.  | ............ | 365/185.03 |
| 2007/0279999 | A1 | * | 12/2007| Watanabe et al. | ......... | 365/185.23 |
| 2008/0101149 | A1 | * | 5/2008 | Fasoli et al. | ............ | 365/230.06 |

* cited by examiner

*Primary Examiner*—Hoai V Ho
*Assistant Examiner*—Jay Radke
(74) *Attorney, Agent, or Firm*—Winston Hsu

(57) ABSTRACT

Non-volatile memory includes a row driving circuit with shared level shift circuits, so as to minimize the chip area of the non-volatile memory. The row driving circuit includes a plurality of word line driving circuits, a plurality of level shift high circuits, and a plurality of level shift low circuits. The plurality of word line driving circuits share the plurality of level shift high circuits and the plurality of level shift low circuits. Each word line driving circuit includes a plurality of driving units, a level shift high circuit, and a level shift low circuit. The plurality of driving units share the level shift high circuit and the level shift low circuit of the word line driving circuit.

12 Claims, 8 Drawing Sheets

| | HLU | HLD | WL | VL | VLB | VBB | VPP |
|---|---|---|---|---|---|---|---|
| A | 1.8 | 1.8 | -1.2 | -1.2 | 1.8 | -1.2 | 1.8 |
| B | 1.8 | 1.8 | 1.8 | 1.8 | 0 | -1.2 | 1.8 |
| C | 0 | -1.2 | 1.8 | -1.2 | 1.8 | -1.2 | 1.8 |
| D | 0 | -1.2 | 1.8 | 1.8 | 0 | -1.2 | 1.8 |

Fig. 8

NON-VOLATILE MEMORY HAVING A ROW DRIVING CIRCUIT WITH SHARED LEVEL SHIFT CIRCUITS

BACKGROUND OF THE INVENTION

1. Field of the Invention

The present invention relates to non-volatile memory, and more particularly, non-volatile memory having a row driving circuit with shared level shift circuits.

2. Description of the Prior Art

Please refer to FIG. 1. FIG. 1 is a block diagram of prior art flash memory 10. The flash memory 10 comprises a first decoding circuit 12, a second decoding circuit 14, a row driving circuit 16, a power supply circuit 18 and a plurality of memory blocks 20a, 20b each comprising a plurality of memory units 24. The row driving circuit 16 comprises a plurality of word line driving circuits 22a, 22b each for driving a plurality of word lines WL0~WLn. Each of the word lines WL0~WLn is connected to a plurality of memory units 24. The first decoding circuit 12 is used to decode a memory address Add of the flash memory 10 so as to generate a first decoding signal XP for selecting one of the word line driving circuit 22a, 22b. If the word line driving circuit 22a is selected, the word line driving circuit 22a will be used to access the memory block 20a because the memory block 20a is connected to the word line driving circuit 22a. The second decoding circuit 14 is used to decode the memory address Add so as to generate a second decoding signal XT for selecting one of the word lines WL0~WLn. The power supply circuit 18 provides power to the row driving circuit 16 so as to access data to and from the memory blocks 20a, 20b.

Please refer to FIG. 2. FIG. 2 is a circuit diagram of the word line driving circuit 22a. The word line driving circuit 22a comprises a NAND gate 26 and a plurality of NOR gates 28a~28c. The first decoding signal XP is used to select one of the word line driving circuits 22a, 22b of the row driving circuit 16. If the row driving circuit 16 has eight word line driving circuits, then three first decoding signals XPA, XPB, XPC are input to the NAND gate 26 of each word line driving circuit 22a, 22b to enable one of the eight word line driving circuits. Further each of the word line driving circuit 22a, 22b comprises eight NOR gates each corresponding to a word line. For example, the NOR gate 28a is corresponding to a word line WL0, the NOR gate 28b is corresponding to a word line WL1, and the NOR gate 28c is corresponding to a word line WL7. Because the word line driving circuit 22a is connected to eight word lines WL0~WL7, the second decoding signal XT comprises eight decoding signals XT0~XT7 for selecting one of the word lines WL0~WL7 accordingly.

Between each of the NOR gates and its corresponding word line WL0~WL7 is connected a level shift circuit. For instance, the NOR gate 28a is connected to a level shift circuit 30a, the NOR gate 28b is connected to a level shift circuit 30b, and the NOR gate 28c is connected to a level shift circuit 30c. The level shift circuits 30a, 30b, 30c have identical circuit structure. Each of the level shift circuits 30a, 30b, 30c comprises two P-type transistors 32a, 32c, two N-type transistors 32b, 32d, and an inverter 34. When the flash memory 10 accesses data, the power supply circuit 18 will output 3.3V for V1 and 0V for V2 respectively. Thus when the output end of the NOR gate 28a has a logic value of 1, the transistor 32b will be turned on so that a node P1 will have a voltage close to 0V (logic 0), and the transistor 32c will be turned on so that a node P2 will have a voltage close to 3.3V (logic 1) while the transistors 32a, 32d are closed. Thus the word line WL0 will output a voltage of 3.3V.

In the prior art, each of the word line WL0~WL7 is connected to a corresponding level shift circuit. And each of the level shift circuits is composed of at least six transistors. However the flash memory 10 generally has many word lines, thus a massive number of transistors need to be disposed on the row driving circuit 16, making the chip of the flash memory 10 oversized.

SUMMARY OF THE INVENTION

According to an embodiment of the present invention, a row driving circuit of non-volatile memory comprises a plurality of first level shift circuit, a plurality of second level shift circuit, and a plurality of word line driving circuits. The plurality of first level shift circuit each comprise an input end for inputting a second decoding signal of an address of the non-volatile memory, a high potential end for outputting a high potential which is greater than a potential of a power source, and an output end for outputting a voltage between a potential of ground and the high potential. The plurality of second level shift circuit each comprise an input end for inputting a signal generated from a second decoding signal of the address of the non-volatile memory, a low potential end for outputting a low potential which is lower than the potential of the ground, and an output end for outputting a voltage between the low potential and the potential of the power source. The plurality of word line driving circuits each comprise a third level shift circuit, a fourth level shift circuit, and a plurality of driving units. The third level shift circuit comprises an input end for inputting a signal generated from a first decoding signal of the address of the non-volatile memory, a high potential end for outputting the high potential, and an output end for outputting a voltage between the potential of the ground and the high potential. The fourth level shift circuit comprises an input end for inputting the signal generated from the first decoding signal of the address of the non-volatile memory, a low potential end for outputting the low potential, and an output end for outputting a voltage between the low potential and the potential of the power source. The plurality of driving units each comprise an N-type transistor, a first P-type transistor and a second P-type transistor. The N-type transistor comprises a substrate for receiving the low potential, a gate coupled to the output end of the fourth level shift circuit, a drain coupled to a word line of the non-volatile memory, and a source coupled to an output end of a corresponding second level shift circuit. The first P-type transistor comprises a substrate for receiving the high potential, a gate coupled to the output end of the third level shift circuit, a source coupled to the substrate of the first P-type transistor, and a drain coupled to the drain of the N-type transistor. The second P-type transistor comprises a substrate for receiving the high potential, a gate coupled to an output end of a corresponding first level shift circuit, a source coupled to the substrate of the second P-type transistor, and a drain coupled to the drain of the N-type transistor.

According to another embodiment of the present invention, non-volatile memory comprises a plurality of memory blocks, a first decoding circuit, a second decoding circuit and a row driving circuit. Each of the memory blocks is coupled to a plurality of word lines each coupled to a plurality of memory units. The first decoding circuit is used to generate a decoding signal for selecting one of the memory blocks. The second decoding circuit is used to generate a decoding signal for selecting a word line from the plurality of word lines coupled to the memory block. The row driving circuit comprises a plurality of first level shift circuits, a plurality of second level shift circuits, and a plurality of word line driving circuits. Each of the first level shift circuits is coupled to the second decoding circuit and is capable of outputting a ground potential and a high potential which is greater than a potential of a power source. Each of the second level shift circuits is coupled to the second decoding circuit and is capable of outputting a low potential which is lower than the ground potential and the potential of the power source. Each of the word line driving circuits comprises a third level shift circuit coupled to the first decoding circuit capable of outputting the ground potential and the high potential, a fourth level shift circuit coupled to the first decoding circuit capable of outputting the low potential and the potential of the power source, and a plurality of driving units. Each of the driving units is coupled to a word line and comprises an N-type transistor coupled to a corresponding second level shift circuit and the fourth level shift circuit, a first P-type transistor coupled to the third level shift circuit, and a second P-type transistor coupled to a corresponding first level shift circuit.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 8 is an operation voltage comparison table of some of the driving units in FIG. 7.

DETAILED DESCRIPTION

Figure 1:
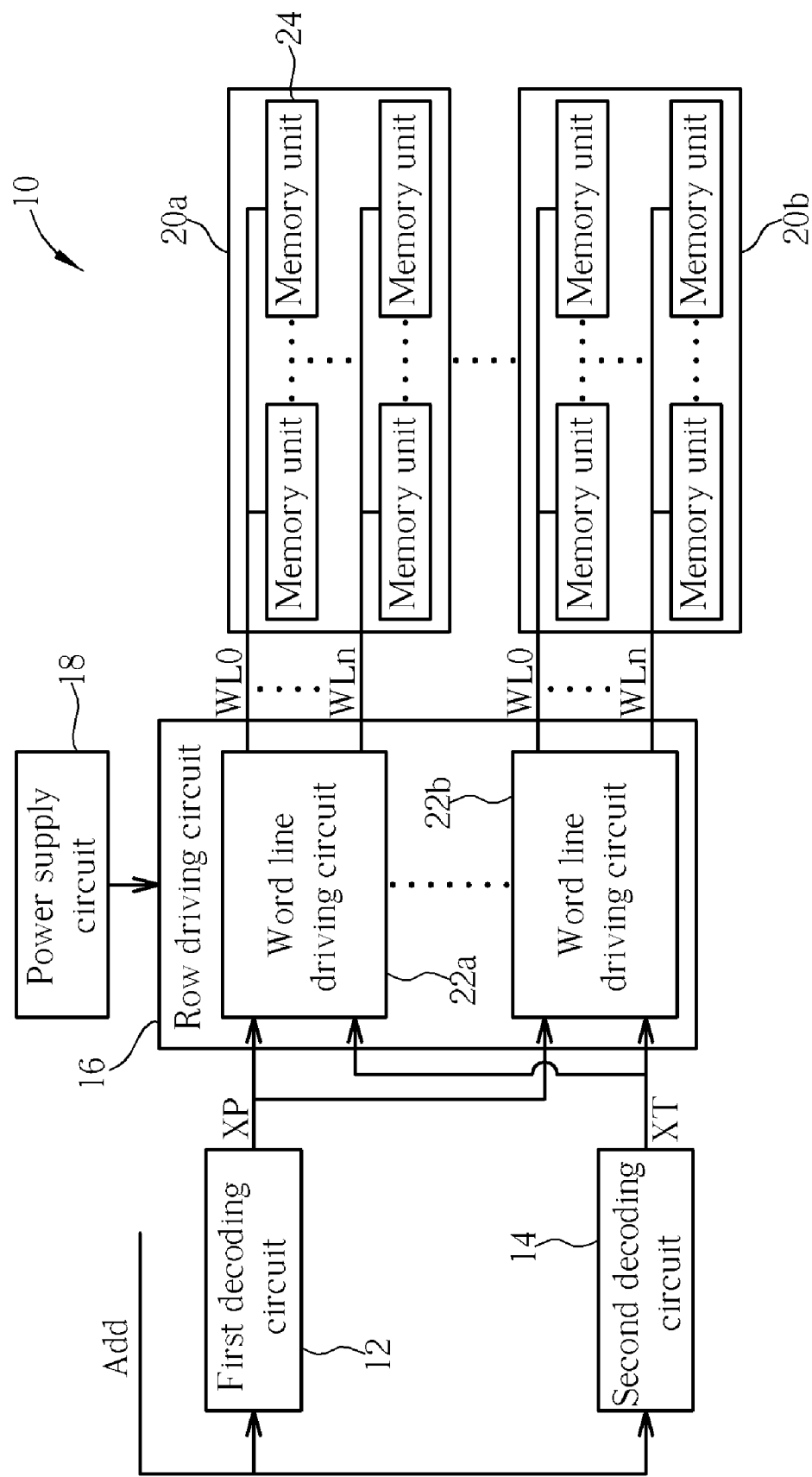
FIG. 1 is a block diagram of prior art flash memory.
Figure 2:
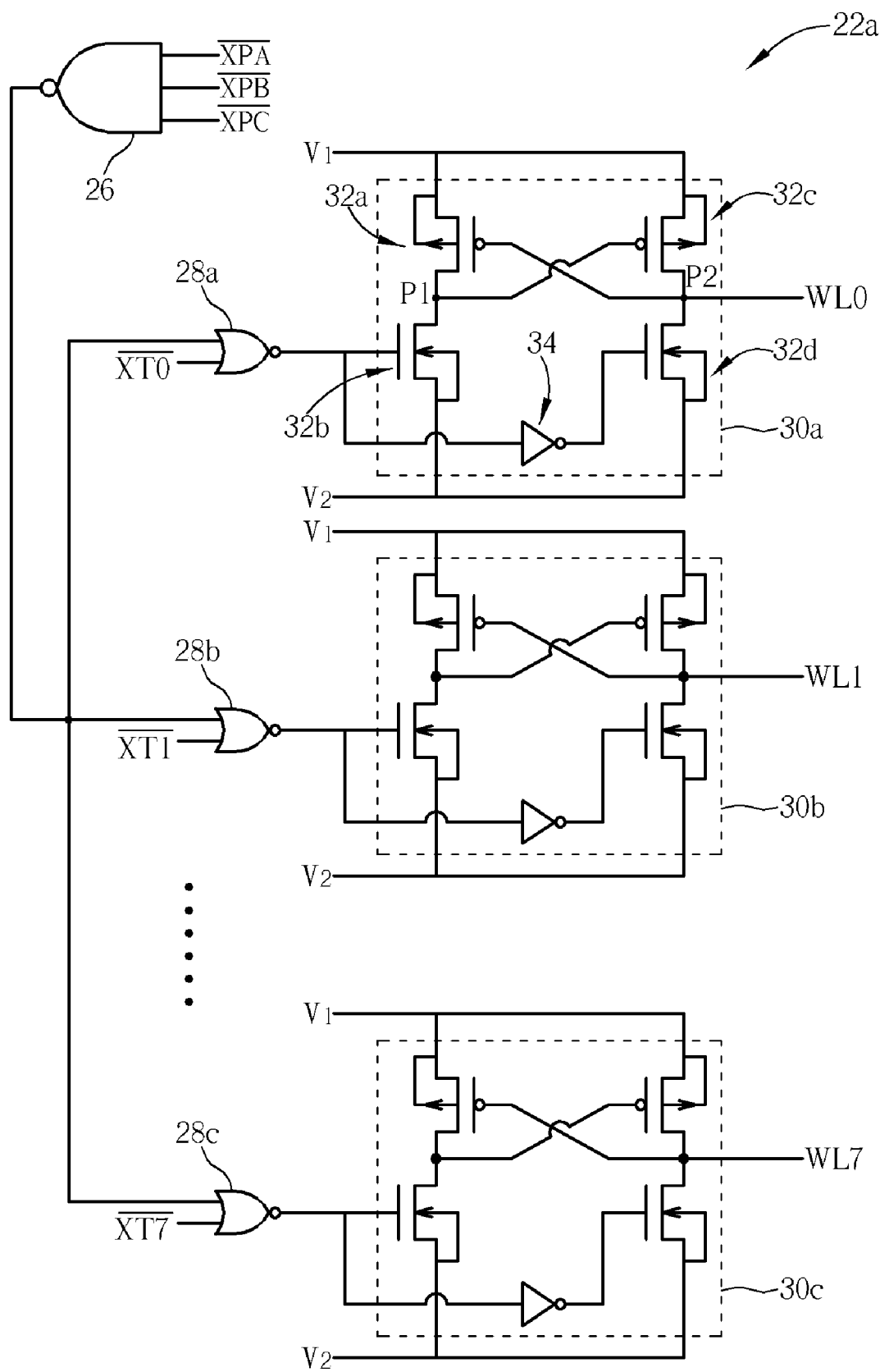
FIG. 2 is a circuit diagram of one of the word line driving circuits of the flash memory in FIG. 1.
Figure 3:
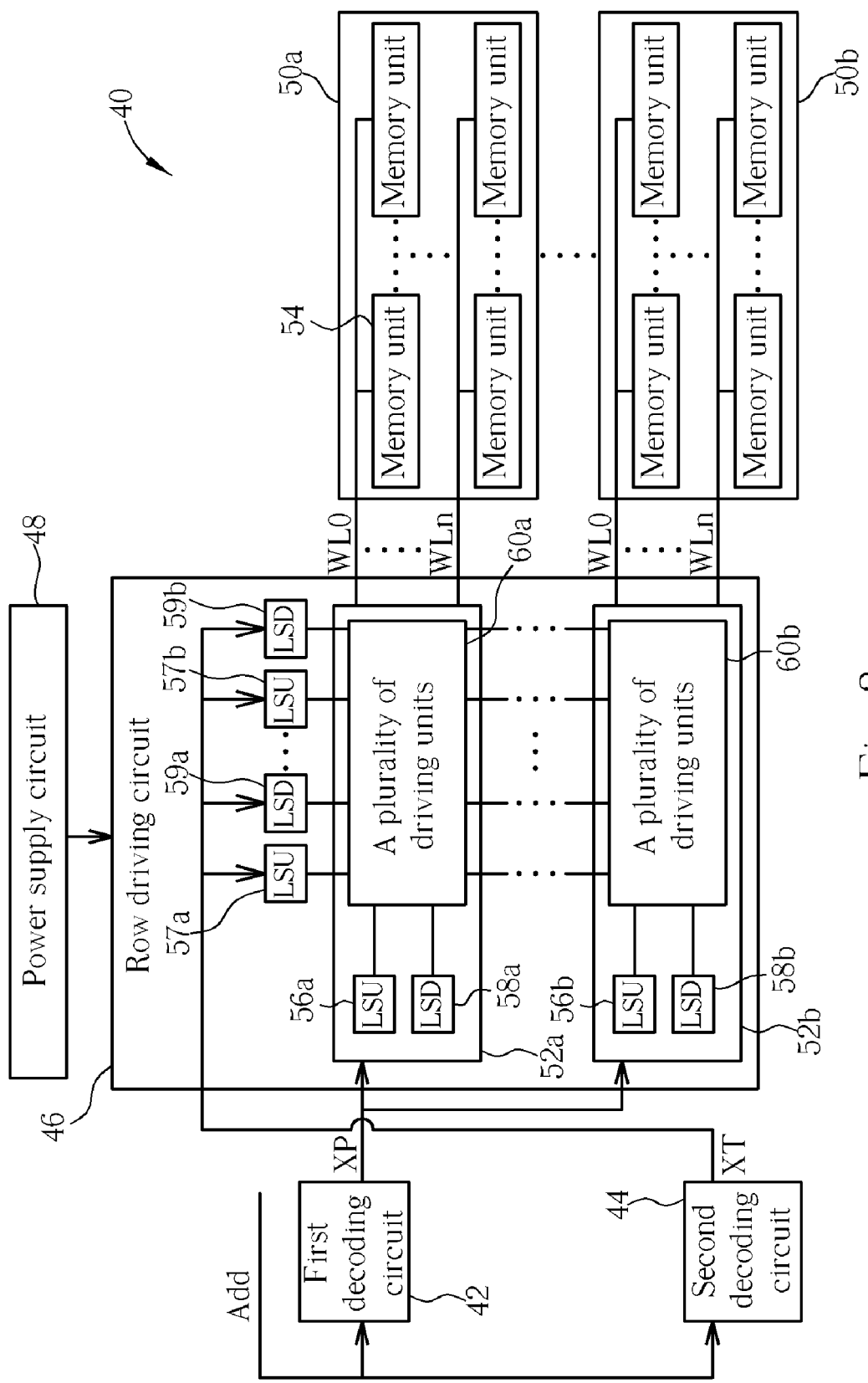
FIG. 3 is a block diagram of flash memory according to an embodiment of the present invention.

Please refer to FIG. 3. FIG. 3 is a block diagram of flash memory 40 according to an embodiment of the present invention. In this embodiment, the flash memory 40 is used to represent non-volatile memory. The flash memory 40 comprises a first decoding circuit 42, a second decoding circuit 44, a row driving circuit 46, a power supply circuit 48 and a plurality of memory blocks 50a, 50b. Each of the memory blocks 50a, 50b is connected to a plurality of word lines WL0~WLn each coupled to a plurality of memory units 54. The row driving circuit 46 comprises a plurality of level shift up circuits 57a, 57b, a plurality of level shift down circuits 59a, 59b and a plurality of word line driving circuits 52a, 52b sharing the level shift up circuits 57a, 57b and the level shift down circuits 59a, 59b. Each of the word line driving circuits 52a, 52b comprises a level shift up circuit 56a, 56b, a level shift down circuit 58a, 58b and a plurality of driving units 60a, 60b. In the word line driving circuit 52a, the plurality of driving units 60a share the level shift up circuit 56a, and the level shift down circuit 58a, and each driving unit of the word line driving circuit 52a is coupled to one of the word lines WL0~WLn. The first decoding circuit 42 is used to decode a memory address Add of the flash memory 40 so as to generate a first decoding signal XP for selecting one of the memory blocks 50a, 50b. The second decoding circuit 44 is used to decode the memory address Add so as to generate a second decoding signal XT for selecting one of the word lines WL0~WLn. The power supply circuit 48 provides power to the row driving circuit 46 so as to access data to and from the memory blocks 50a, 50b.

Figure 4:
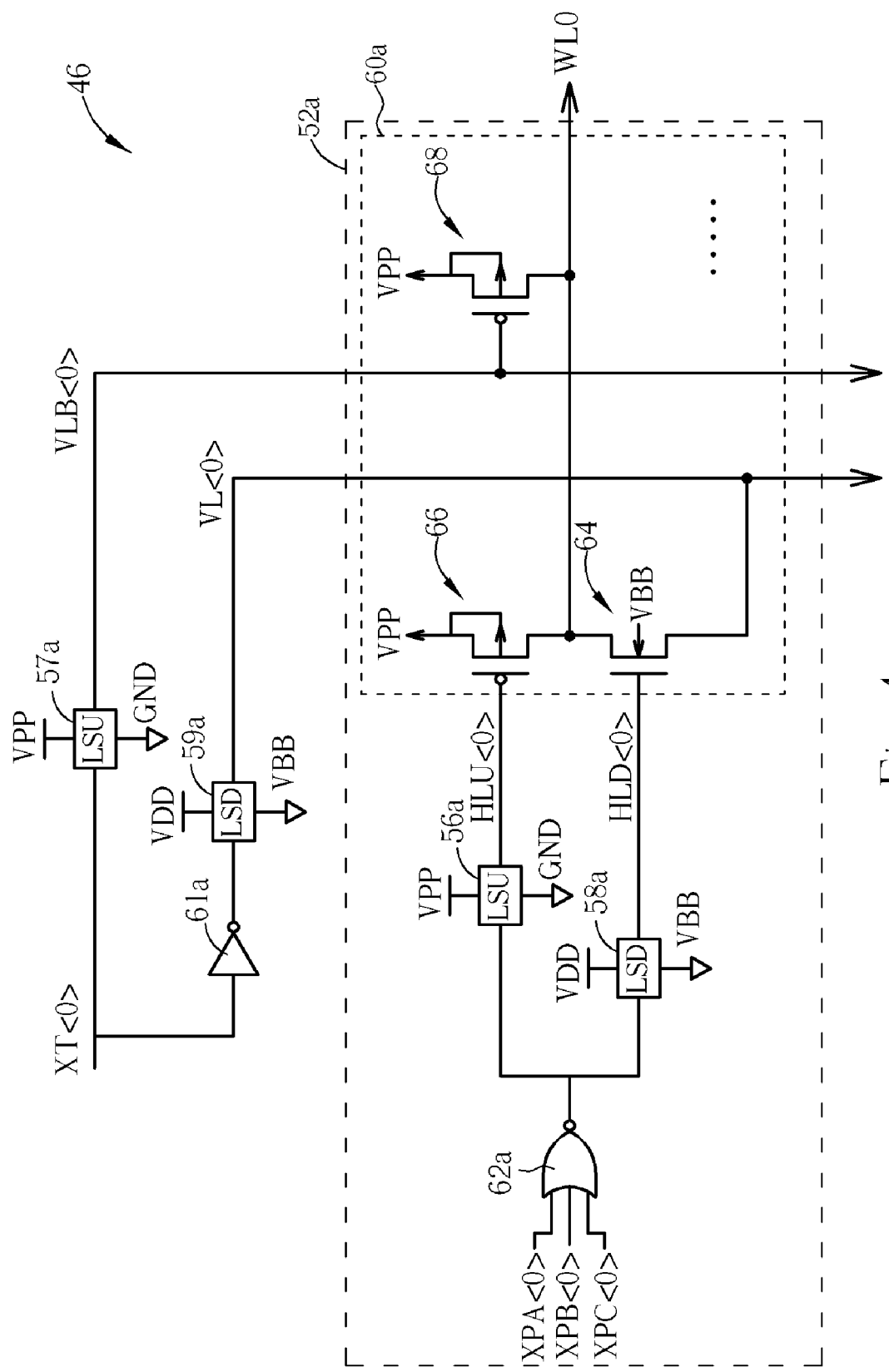
FIG. 4 is a circuit diagram of the row driving circuit of the flash memory in FIG. 3.

Please refer to FIG. 4. FIG. 4 is a circuit diagram of the row driving circuit 46 in FIG. 3. For simplicity, the operation is explained by the first word line driving circuit 52a, and a first driving unit of the plurality of driving units 60a. The level shift up circuits 56a, 57a each comprise an input end, a high potential end VPP for outputting a voltage higher than a potential of a power supply end VDD, and an output end for outputting a voltage between a potential of ground GND and the voltage of the high potential end VPP. The level shift down circuits 58a, 59a each comprise an input end, a low potential end VBB for outputting a voltage lower than the potential of the ground GND, and an output end for outputting a voltage between the voltage of the low potential end VBB and the potential of the power supply end VDD. Each of the driving units comprises an N-type transistor 64, a first P-type transistor 66 and a second P-type transistor 68. The N-type transistor 64 has a substrate coupled to the low potential end VBB, a gate coupled to the output end of the level shift down circuit 58a, a drain coupled to the word line WL0, and a source coupled to the output end of the level shift down circuit 59a. The first P-type transistor 66 has a substrate coupled to the high potential end VPP, a gate coupled to the output end of the level shift up circuit 56a, a source coupled to the high potential end VPP, and a drain coupled to the drain of the N-type transistor 64. The second P-type transistor 68 has a substrate coupled to the high potential end VPP, a gate coupled to the output end of the level shift up circuit 57a, a source coupled to the high potential end VPP, and a drain coupled to the drain of the N-type transistor 64. The N-type transistor 64 and the P-type transistors 66, 68 can be formed by performing a CMOS (complementary metal oxide semiconductor) process.

The first decoding signals XPA<0>, XPB<0>, XPC<0> are input to a NOR gate 62a, then an output of the NOR gate 62a is input to the level shift up circuit 56a and the level shift down circuit 58a of the word line driving circuit 52a. The level shift up circuit 56a and the level shift down circuit 58a then generate driving signals HLU<0> and HLD<0> respectively to drive the plurality of driving units 60a. Thus in the word line driving circuit 52a, the plurality of driving units 60a share the level shift up circuit 56a and the level shift down circuit 58a. Moreover, the second decoding signal XT<0> is input to the level shift up circuit 57a and an inverter 61a coupled to the level shift down circuit 59a. Then the level shift up circuit 57a and the level shift down circuit 59a generate driving signals VLB<0> and VL<0> respectively so as to drive the first driving unit of each word line driving circuit. Therefore the plurality of word line driving circuits share the level shift up circuit 57a and the level shift down circuit 59a. Each time only one word line is selected by the first decoding signal XP and the second decoding signal XT. That is, only one driving unit of the row driving circuit 46 is driven. When a driving unit is selected, the logic value of the driving signal VLB<0> is 1, and the logic values of the driving signals HLU<0> and HLD<0> are 1, thus the P-type transistors 66, 68 are turned off, and the N-type transistor 64 is turned on. And thus the driving unit will output a logic value of 0 of the driving signal VL<0> to its corresponding word line. Therefore the N-type transistor 64 functions as a pull down transistor of the driving unit. The first P-type transistor 66 functions as a pull up transistor of the driving unit. And the second P-type transistor 68 functions as a reset transistor of the driving unit.

Figure 5:
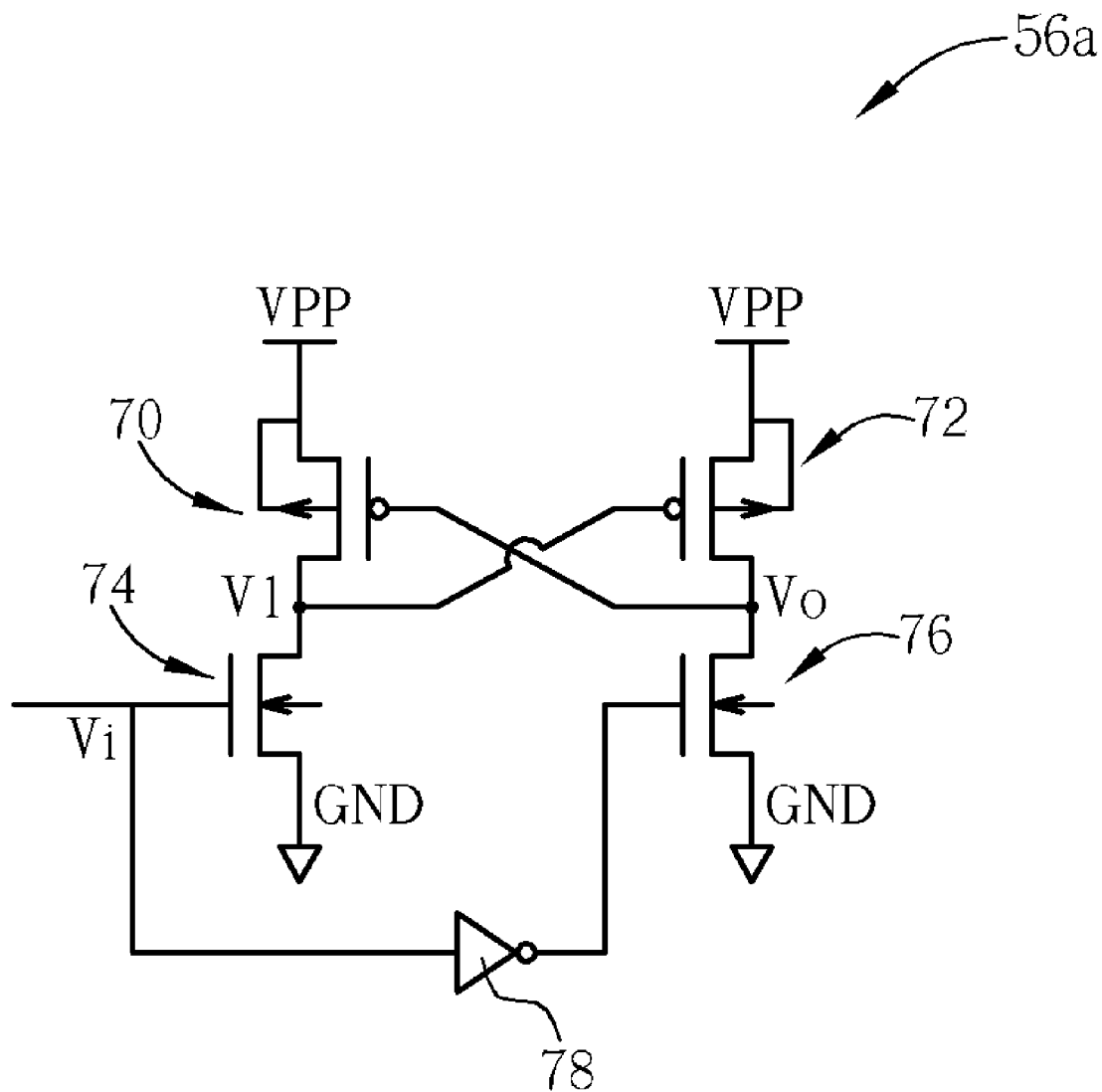
FIG. 5 is a circuit diagram of one of the level shift up circuits of the flash memory in FIG. 3.

Please refer to FIG. 5. FIG. 5 is a circuit diagram of the level shift up circuit 56a. The level shift up circuit 56a comprises two P-type transistors 70, 72, two N-type transistors 74, 76 and an inverter 78. The P-type transistor 70 has a drain coupled to a drain of the N-type transistor 74 and a gate of the P-type transistor 72. The P-type transistor 70 also has a gate coupled to a drain of the P-type transistor 72 and a drain of the N-type transistor 76. The inverter 78 is coupled between a gate of the N-type transistor 74 and a gate of the N-type transistor 76. The gate of the N-type transistor 74 is an input node Vi of the level shift up circuit 56a. The drain of the P-type transistor 72 is an output node Vo of the level shift up circuit 56a. When a logic value of 1 is input to the input node Vi, the N-type transistor 76 is turned off and the N-type transistor 74 is turned on, thus dragging the node V1 to the ground. Then the P-type transistor 72 is turned on, the output node Vo is dragged to VPP, and the P-type transistor 70 is turned off. Therefore the logic level of 1 in the input node Vi will cause the output node Vo to output VPP. When a logic value of 0 is input to the input node Vi, the N-type transistor 74 is turned off and the N-type transistor 76 is turned on, thus dragging the output node Vo to the ground. Then the P-type transistor 70 is turned on, the node V1 is dragged to VPP, and the P-type transistor 72 is turned off. Therefore the level shift up circuit 56a will output GND when the input node Vi has a logic level of 0.

Figure 6:
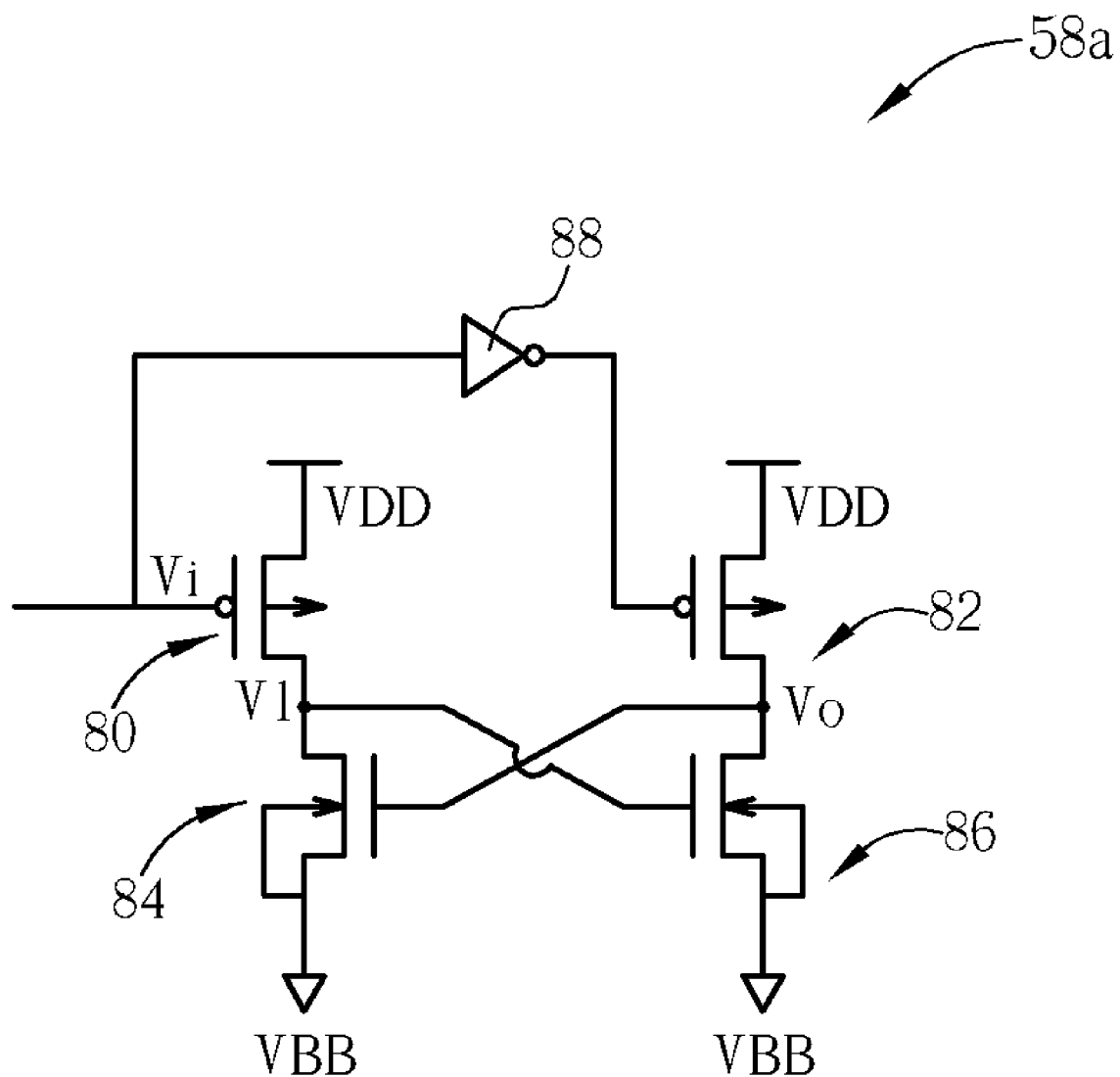
FIG. 6 is a circuit diagram of one of the level shift down circuits of the flash memory in FIG. 3.

Please refer to FIG. 6. FIG. 6 is a circuit diagram of the level shift down circuit 58a. The level shift down circuit 58a comprises two P-type transistors 80, 82, two N-type transistors 84, 86 and an inverter 88. The P-type transistor 80 has a drain coupled to a drain of the N-type transistor 84 and a gate of the N-type transistor 86. The N-type transistor 84 has a gate coupled to a drain of the P-type transistor 82 and a drain of the N-type transistor 86. The inverter 88 is coupled between a gate of the P-type transistor 80 and a gate of the P-type transistor 82. The level shift down circuit 58a will output VDD when the input node Vi has a logic level of 1, and will output VBB when the input node Vi has a logic level of 0.

Figure 7:
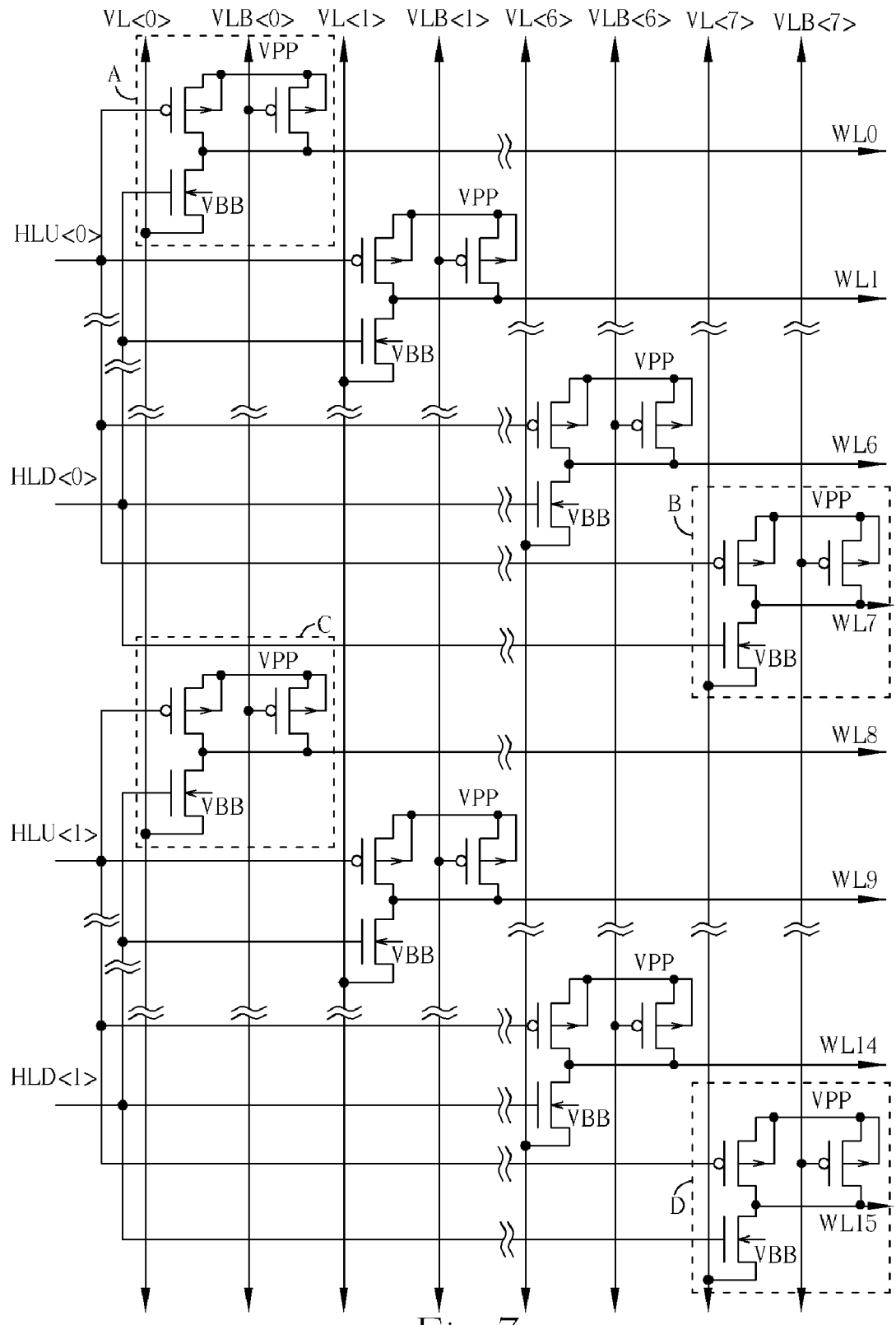
FIG. 7 is a circuit diagram of some of the plurality of driving units in FIG. 3.

Please refer to FIGS. 7 and 8. FIG. 7 is a circuit diagram of a plurality of driving units. FIG. 8 is an operation voltage comparison table of some of the driving units in FIG. 7. FIGS. 7 and 8 use the flash memory 40 as an example, and detail the operation voltages of the driving units A, B, C, D under the assumptions that the word line WL0 is to be selected, VPP is 1.8V, VBB is −1.2V and GND is 0V. The first decoding signal XP generates driving signals HLU, HLD through each word line driving circuit for selecting a memory block of the flash memory 40, so only one word line driving circuit generates driving signals HLU, HLD with logic values of 1, such as the driving signals HLU<0>, HLD<0> input to the driving units A, B. The second decoding signal XT generates driving signals VL and VLB through the row driving circuit 46 for selecting a word line connected to each memory block. Thus only one of the driving signals VL has a logic value of 0, such as the driving signal VL<0> input to the driving units A, C. Since in this example, only the driving unit A is inputted logic values of 1 for the driving signals HLU<0>, HLD<0> and a logic value of 0 for the driving signal VL<0>, only the word line WL0 which is connected to the driving unit A will be selected and will output a voltage of −1.2V.

In summary, the non-volatile memory of the present invention comprises a row driving circuit with shared level shift circuits, thus can minimize the chip area of the non-volatile memory. The row driving circuit comprises a plurality of word line driving circuits, a plurality of level shift up circuits, and a plurality of level shift down circuits. The plurality of word line driving circuits share the plurality of level shift up circuits, and the plurality of level shift down circuits. Each of the word line driving circuits comprises a plurality of driving units, a level shift up circuit, and a level shift down circuit. The plurality of driving units share the level shift up circuit, and the level shift down circuit. Each of the driving units comprises an N-type transistor and two P-type transistors, and is connected to a corresponding word line. When a driving unit outputs a logic value of 0, its corresponding word line is selected.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A row driving circuit of non-volatile memory for driving memory units of a first memory block and a second memory block according to an address, the address being decoded into a first decoding signal and a second decoding signal, the first memory block comprising N word lines, each word line of the first memory block being coupled to a plurality of memory units of the first memory block, the second memory block comprising N word lines, each word line of the second memory block being coupled to a plurality of memory units of the second memory block, the first memory block or the second memory block being selected by the row driving circuit according to the first decoding signal, a $K^{th}$ word line of the first memory block being selected according to the second decoding signal when the first memory block is selected, a $K^{th}$ word line of the second memory block being selected according to the second decoding signal when the second memory block is selected, the row driving circuit comprising:

N level shift up circuits, wherein a $K^{th}$ level shift up circuit comprises:
an input end for receiving the second decoding signal;
a high potential end for outputting a high potential which is greater than a potential of a power source; and
an output end for outputting a voltage between a potential of ground and the high potential when the second decoding signal selects the $K^{th}$ word line of the first memory block or the $K^{th}$ word line of the second memory block;

N level shift down circuits, wherein a $K^{th}$ level shift down circuit comprises:
an input end for receiving an inverted signal of the second decoding signal;
a low potential end for outputting a low potential which is lower than the potential of the ground; and
an output end for outputting a voltage between the low potential and the potential of the power source when the second decoding signal selects the $K^{th}$ word line of the first memory block or the $K^{th}$ word line of the second memory block;

a first word line driving circuit comprising:
a level shift up circuit comprising:
an input end for receiving the first decoding signal;
a high potential end for outputting the high potential; and
an output end for outputting a voltage between the potential of the ground and the high potential when the first decoding signal selects the first memory block;
a level shift down circuit comprising:
an input end for receiving the first decoding signal;

a low potential end for outputting the low potential; and an output end for outputting a voltage between the low potential and the potential of the power source when the first decoding signal selects the first memory block; and N driving units, a $K^{th}$ driving unit comprising:
  a first N-type transistor comprising:
    a substrate for receiving the low potential;
    a gate coupled to the output end of the level shift down circuit of the first word line driving circuit;
    a drain coupled to the $K^{th}$ word line of the first memory block; and
    a source coupled to the output end of the $K^{th}$ level shift down circuit of the row driving circuit;
  a first P-type transistor comprising:
    a substrate for receiving the high potential;
    a gate coupled to the output end of the level shift up circuit of the first word line driving circuit;
    a source coupled to the substrate of the first P-type transistor; and
    a drain coupled to the drain of the first N-type transistor; and
  a second P-type transistor comprising:
    a substrate for receiving the high potential;
    a gate coupled to the output end of the $K^{th}$ level shift up circuit of the row driving circuit;
    a source coupled to the substrate of the second P-type transistor; and
    a drain coupled to the drain of the N-type transistor; and a second word line driving circuit comprising:
  a level shift up circuit comprising:
    an input end for receiving the first decoding signal;
    a high potential end for outputting the high potential; and
    an output end for outputting a voltage between the potential of the ground and the high potential when the first decoding signal selects the second memory block;
  a level shift down circuit comprising:
    an input end for receiving the first decoding signal;
    a low potential end for outputting the low potential; and
    an output end for outputting a voltage between the low potential and the potential of the power source when the first decoding signal selects the second memory block; and
  N driving units, a $K^{th}$ driving unit comprising:
    a second N-type transistor comprising:
      a substrate for receiving the low potential;
      a gate coupled to the output end of the level shift down circuit of the second word line driving circuit;
      a drain coupled to the $K^{th}$ word line of the second memory block; and
      a source coupled to the output end of the $K^{th}$ level shift down circuit of the row driving circuit;
    a third P-type transistor comprising:
      a substrate for receiving the high potential;
      a gate coupled to the output end of the level shift up circuit of the second word line driving circuit;
      a source coupled to the substrate of the third P-type transistor; and
      a drain coupled to the drain of the second N-type transistor; and
    a fourth P-type transistor comprising:
      a substrate for receiving the high potential;
      a gate coupled to the output end of the $K^{th}$ level shift up circuit of the row driving circuit;
      a source coupled to the substrate of the fourth P-type transistor; and
      a drain coupled to the drain of the second N-type transistor.

2. The row driving circuit of claim 1 further comprising N inverters, a $K^{th}$ inverter being coupled to the input end of the $K^{th}$ level shift down circuit of the row driving circuit.

3. The row driving circuit of claim 1 wherein the first word line driving circuit comprises a NOR gate coupled to the level shift up and down circuits of the first word line driving circuit for receiving the first decoding signal; the second word line driving circuit comprises a NOR gate coupled to the level shift up and down circuits of the second word line driving circuit for receiving the first decoding signal.

4. The row driving circuit of claim 1 wherein each of the level shift up circuits of the row driving circuit, the first word line driving circuit, and the second word line driving circuit comprises:
  a first P-type transistor comprising a source for receiving the high potential;
  a second P-type transistor comprising a gate coupled to a drain of the first P-type transistor, a source for receiving the high potential; and a drain coupled to a gate of the first P-type transistor;
  a first N-type transistor comprising a drain coupled to the drain of the first P-type transistor, and a source coupled to ground;
  a second N-type transistor comprising a drain coupled to the drain of the second P-type transistor, and a source coupled to the ground; and
  an inverter coupled between a gate of the first N-type transistor and a gate of the second N-type transistor.

5. The row driving circuit of claim 1 wherein each of the level shift down circuits of the row driving circuit, the first word line driving circuit, and the second word line driving circuit comprises:
  a first N-type transistor comprising a source for receiving the low potential;
  a second N-type transistor comprising a gate coupled to a drain of the first N-type transistor, a source for receiving the low potential, and a drain coupled to a gate of the first N-type transistor;
  a first P-type transistor comprising a drain coupled to the drain of the first N-type transistor, and a source coupled to the power source;
  a second P-type transistor comprising a drain coupled to the drain of the second N-type transistor, and a source coupled to the power source; and
  an inverter coupled between a gate of the first P-type transistor and a gate of the second P-type transistor.

6. The row driving circuit of claim 1 wherein the first N-type transistor is a pull down transistor of the $K^{th}$ driving unit of the first word line driving circuit, the first P-type transistor is a pull up transistor of the $K^{th}$ driving unit of the first word line driving circuit, and the second P-type transistor is a reset transistor of the $K^{th}$ driving unit of the first word line driving circuit; the second N-type transistor is a pull down transistor of the $K^{th}$ driving unit of the second word line driving circuit, the third P-type transistor is a pull up transistor of the $K^{th}$ driving unit of the second word line driving circuit, and the fourth P-type transistor is a reset transistor of the $K^{th}$ driving unit of the second word line driving circuit.

7. The row driving circuit of claim 1 wherein the first and the second N-type transistors, and the first, second, third, and fourth P-type transistors are formed by performing a CMOS (complementary metal oxide semiconductor) process.

8. A non-volatile memory comprising:
   a first and a second memory blocks, each of the first and the second memory blocks comprising N word lines and a plurality of memory units, each word line coupled to a plurality of corresponding memory units;
   a first decoding circuit for generating a first decoding signal for selecting one of the first or the second memory blocks;
   a second decoding circuit for generating a second decoding signal for selecting a $K^{th}$ word line from the N word lines of the first memory block or a $K^{th}$ word line from the N word lines of the second memory block; and
   a row driving circuit comprising:
      N level shift up circuits, a $K^{th}$ level shift up circuit coupled to the second decoding circuit for outputting a ground potential and a high potential which is greater than a potential of a power source when the second decoding signal selects the $K^{th}$ word line of the first memory block or the $K^{th}$ word line of the second memory block;
      N level shift down circuits, a $K^{th}$ level shift down circuit coupled to the second decoding circuit for outputting a low potential which is lower than the ground potential and the potential of the power source when the second decoding signal selects the $K^{th}$ word line of the first memory block or the $K^{th}$ word line of the second memory block;
      a first word line driving circuit, comprising:
         a level shift up circuit coupled to the first decoding circuit for outputting the ground potential and the high potential when the first decoding signal selects the first memory block;
         a level shift down circuit coupled to the first decoding circuit for outputting the low potential and the potential of the power source when the first decoding signal selects the first memory block; and
         N driving units, a $K^{th}$ driving circuit coupled to the $K^{th}$ word line of the first memory block, the $K^{th}$ driving circuit comprising:
            a first N-type transistor coupled to the $K^{th}$ low level shift circuit of the row driving circuit and the level shift down circuit of the first word line driving circuit;
            wherein the first N-type transistor is a pull down transistor of the $K^{th}$ driving unit of the first word line driving circuit;
            a first P-type transistor coupled to the level shift up circuit of the first word line driving circuit;
            wherein the first P-type transistor is a pull up transistor of the $K^{th}$ driving unit of the first word line driving circuit; and
            a second P-type transistor coupled to the $K^{th}$ level shift up circuit of the row driving circuit;
            wherein the second P-type transistor is reset transistor of the $K^{th}$ driving unit of the first word line driving circuit; and
      a second word line driving circuit, comprising:
         a level shift up circuit coupled to the first decoding circuit for outputting the ground potential and the high potential when the first decoding signal selects the second memory block;
         a level shift down circuit coupled to the first decoding circuit for outputting the low potential and the potential of the power source when the first decoding signal selects the second memory block; and
         N driving units, a $K^{th}$ driving circuit coupled to the $K^{th}$ word line of the second memory block, the $K^{th}$ driving circuit comprising:
            a second N-type transistor coupled to the $K^{th}$ level shift down circuit of the row driving circuit and the level shift down circuit of the second word line driving circuit;
            wherein the second N-type transistor is a pull down transistor of the $K^{th}$ driving unit of the second word line driving circuit;
            a third P-type transistor coupled to the level shift up circuit of the second word line driving circuit;
            wherein the third P-type transistor is a pull up transistor of the $K^{th}$ driving unit of the second word line driving circuit; and
            a fourth P-type transistor coupled to the $K^{th}$ level shift up circuit of the row driving circuit;
            wherein the fourth P-type transistor is a reset transistor of the $K^{th}$ driving unit of the second word line driving circuit.

9. The non-volatile memory of claim 8 wherein the row driving circuit further comprises N inverters, a $K^{th}$ inverter being coupled between the $K^{th}$ level shift down circuit of the row driving circuit and the second decoding circuit.

10. The non-volatile memory of claim 8 wherein the first word line driving circuit comprises a NOR gate having an output end coupled to the level shift up and down circuits of the first word line driving circuit, and an input end coupled to the first decoding circuit; the second word line driving circuit comprises a NOR gate having an output end coupled to the level shift up and down circuits of the second word line driving circuit, and an input end coupled to the first decoding circuit.

11. The non-volatile memory of claim 8 wherein:
   the first N-type transistor of the $K^{th}$ driving circuit of the first word line driving circuit comprises:
      a substrate for receiving the low potential;
      a gate coupled to the output end of the level shift down circuit of the first word line driving circuit;
      a drain coupled to the $K^{th}$ word line of the first memory block; and
      a source coupled to the output end of $K^{th}$ level shift down circuit of the row driving circuit;
   the first P-type transistor of the $K^{th}$ driving circuit of the first word line driving circuit comprises:
      a substrate for receiving the high potential;
      a gate coupled to the output end of the level shift up circuit of the first word line driving circuit;
      a source coupled to the substrate of the first P-type transistor; and
      a drain coupled to the drain of the first N-type transistor; and
   the second P-type transistor of the $K^{th}$ driving circuit of the first word line driving circuit comprises:
      a substrate for receiving the high potential;
      a gate coupled to the output end of the $K^{th}$ level shift up circuit of the row driving circuit;
      a source coupled to the substrate of the second P-type transistor; and
      a drain coupled to the drain of the first N-type transistor;
   the second N-type transistor of the $K^{th}$ driving circuit of the second word line driving circuit comprises:
      a substrate for receiving the low potential;

a gate coupled to the output end of the level shift down circuit of the second word line driving circuit;

a drain coupled to the $K^{th}$ word line of the second memory block; and a source coupled to the output end of $K^{th}$ level shift down circuit of the row driving circuit;

the third P-type transistor of the $K^{th}$ driving circuit of the second word line driving circuit comprises:

a substrate for receiving the high potential;

a gate coupled to the output end of the level shift up circuit of the second word line driving circuit;

a source coupled to the substrate of the third P-type transistor; and a drain coupled to the drain of the second N-type transistor; and the fourth P-type transistor of the $K^{th}$ driving circuit of the second word line driving circuit comprises:

a substrate for receiving the high potential;

a gate coupled to the output end of the $K^{th}$ level shift up circuit of the row driving circuit;

a source coupled to the substrate of the fourth P-type transistor; and a drain coupled to the drain of the second N-type transistor.

12. The non-volatile memory of claim 8 wherein the first, and the second N-type transistors, and the first, second, third, and fourth P-type transistors are formed by performing a CMOS (complementary metal oxide semiconductor) process.

* * * * *